(12) United States Patent
Wang

(10) Patent No.: US 7,940,125 B2
(45) Date of Patent: May 10, 2011

(54) POWER AMPLIFIER, POWER AMPLIFIER CIRCUIT AND POWER AMPLIFYING METHOD

(75) Inventor: Po-Chih Wang, Kaohsiung (TW)

(73) Assignee: Realtek Semiconductor Corporation, Hsin-Chu (TW)

( * ) Notice: Subject to any disclaimer, the term of this patent is extended or adjusted under 35 U.S.C. 154(b) by 70 days.

(21) Appl. No.: 12/387,177

(22) Filed: Apr. 29, 2009

(65) Prior Publication Data
US 2009/0273399 A1    Nov. 5, 2009

(30) Foreign Application Priority Data

Apr. 30, 2008 (TW) ............................... 97115835 A (51) Int. Cl.
*H03F 1/22* (2006.01)
(52) U.S. Cl. ...................................................... 330/311
(58) Field of Classification Search .................. 330/136, 330/285, 311
See application file for complete search history.

(56) References Cited

U.S. PATENT DOCUMENTS

| 6,784,740 B1 * | 8/2004 | Tabatabaei | 330/279 |
| 7,164,321 B2 * | 1/2007 | Behzad | 330/311 |

* cited by examiner

*Primary Examiner* — Steven J Mottola
(74) *Attorney, Agent, or Firm* — Tung & Associates (57) ABSTRACT

The present invention discloses a power amplifier, comprising: a first transistor having a gate receiving an input signal; a second transistor coupled to the first transistor in a cascode configuration, in which a source of the second transistor is coupled to a drain of the first transistor, and a drain of the second transistor outputs an amplified signal; and a dynamic biasing circuit having two input terminals, one of which receiving the input signal, and the other one coupled to the drain of the first transistor, and an output terminal being coupled to a gate of the second transistor, thereby modulating the voltage at the drain of the first transistor.

11 Claims, 7 Drawing Sheets

POWER AMPLIFIER, POWER AMPLIFIER CIRCUIT AND POWER AMPLIFYING METHOD

BACKGROUND

1. Field of Invention

The present invention relates to a power amplifier, and in particular to a power amplifier, a power amplifier circuit, and an amplifying method, which reduces a voltage drop across a transistor by adjusting a bias voltage.

2. Description of Related Art

In wireless communication devices, various power amplifiers are utilized to amplify a signal to be transmitted. Among these power amplifiers, a metal oxide semiconductor field effect transistor (MOSFET) power amplifier is typically used in the communication devices to amplify a signal because of its features such as low cost and high integrity.

Figure 5:
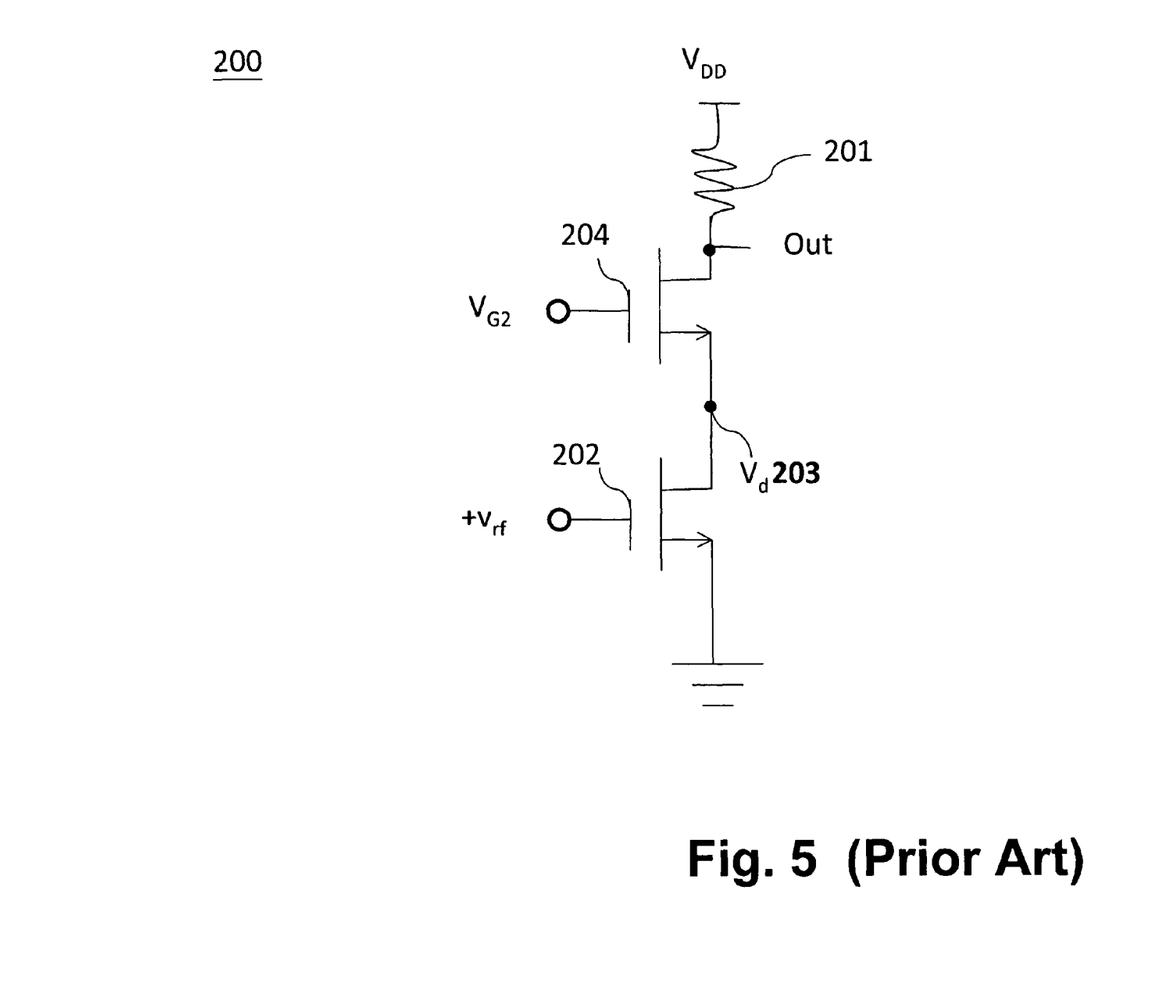
FIG. 5 shows a circuit diagram of a cascoded power amplifier according the prior art.

However, when the FET functions as an amplifier for a radio frequency (RF) input signal, its lifetime is reduced due to damages such as hot carrier effects and breakdown of an oxide layer in the transistor caused by its high bias voltage and a high peak value of the RF signal. Further, these adverse effects are more serious as the transistor is made smaller and the channel is shorter in more advanced semiconductor processes. To overcome such problems, a power amplifier having two transistors arranged in a cascode configuration is proposed in the article entitled "A 2.4 GHz 0.18 um CMOS Self-Biased Cascode Power Amplifier with 23 dBm Output Power," by Sowalti and D. Leenaerts and published in *ISSCC Dig. Tech. Papers*, pp. 294-295, February, 2002. FIG. 5 shows such an power amplifier 200 having two MOSFETs 202 and 204 arranged in a cascode configuration. In general, the MOSFET 204 functions as a common gate transistor so as to provide an output terminal to an amplified signal, its gate normally receives a DC bias voltage such as 3.3 V, and it sustains a high voltage difference $V_{ds}$ (drain to source) if an input signal has a high power. The MOSFET 202 functions as a common source transistor and its gate receives a DC bias voltage (not shown in the figure) and the RF input signal $v_{rf}$. Since there are two transistors in such a configuration, the damage to the transistors caused by the peak values of the input signal can be reduced. For example, the amplifier 200 according to the prior art may generate a voltage drop up to 6 volts across the drain and the source in the MOSFET 202, but a MOSFET fabricated by a 65 nm semiconductor process can only endure a voltage drop of about 1.2 volts (V) across the drain and the source. Therefore, the transistor such as the MOSFET 202 in the power amplifier is likely to be damaged by the high voltage drop and accordingly its lifetime and reliability are reduced.

Figure 6:
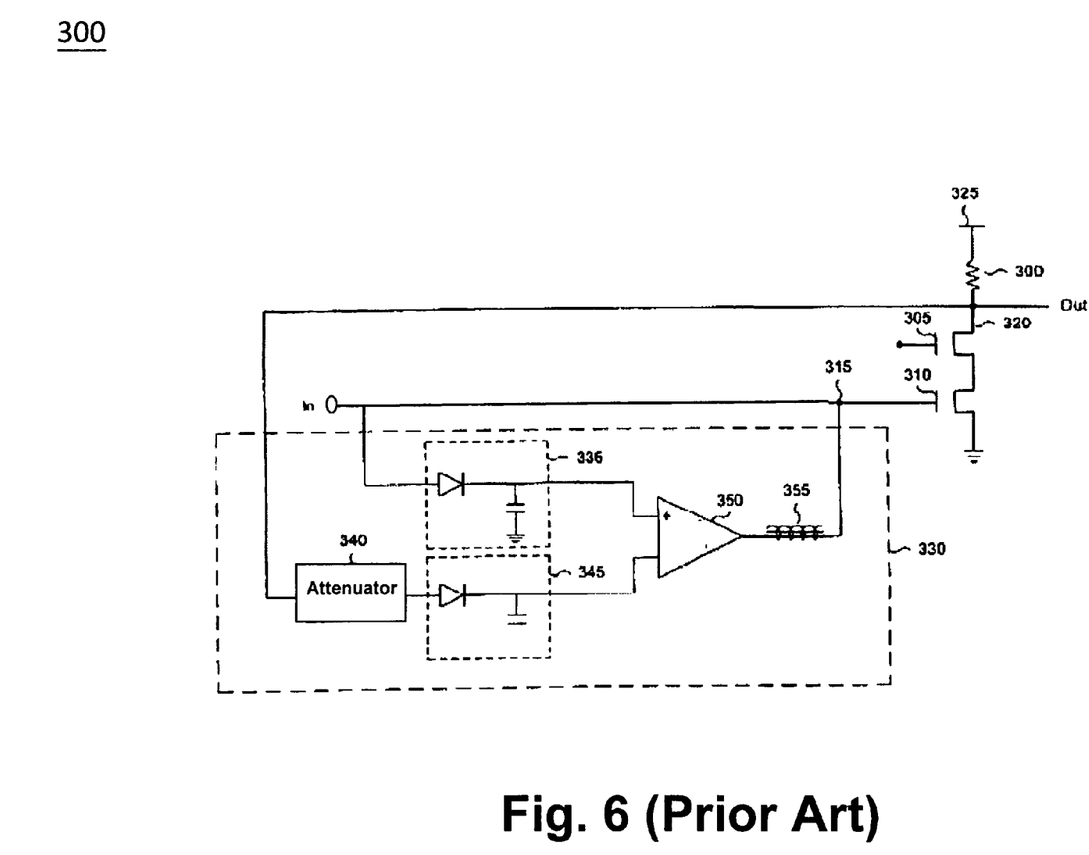
FIG. 6 shows a circuit diagram of a cascoded power amplifier provided with feedback control according the prior art.

Further, in the U.S. Pat. No. 6,784,740, a power amplifier using a feedback technology is disclosed. FIG. 6 shows the power amplifier of this patent document, which is a combination of a feedback circuit and the circuit shown in FIG. 5. The feedback circuit 330 receives a RF input signal at its positive input terminal, and its negative input terminal is connected to an output terminal Out. The output terminal of the feedback circuit 330 is connected to the gate terminal of the FET transistor 310 for adjusting its bias voltage so that power consumption is reduced for a low power input signal and linearity is improved for a high power input signal. However, in such a prior art circuit, the damage to the transistor functioning as the common source caused by the high voltage drop across the drain and the source is not prevented, and no protection function for the transistor is provided.

Therefore, it is desirable to provide a power amplifier that can effectively reduce the voltage drop across the drain and the source of the transistor functioning as the common source in the power amplifier in order to improve reliability and lifetime of the power amplifier.

SUMMARY OF THE INVENTION

According to one aspect of the invention, a power amplifier comprises: a first transistor having a gate receiving an input signal; a second transistor coupled to the first transistor in a cascoded configuration, in which a source of the second transistor is coupled to a drain of the first transistor, and a drain of the second transistor outputs an amplified signal; and a dynamic biasing circuit having two input terminals, one of which receiving the input signal, and the other one coupled to the drain of the first transistor, and an output terminal being coupled to a gate of the second transistor, thereby to modulating a voltage at the drain of the first transistor.

According to another aspect of the invention, a power amplifier circuit comprises: a power amplifier receiving an input signal and a biasing signal and generating an amplified signal according to the input signal; and a bias adjustment unit being coupled to the amplifier to receive the input signal, and generating the biasing signal according to the input signal.

According to still another aspect of the invention, an amplifying method comprising steps of: outputting a biasing signal according to an input signal, wherein the biasing signal corresponds to the input signal; and providing a power amplifier receiving the input signal and the biasing signal, and generating an amplified signal according the input signal.

Preferably, the dynamic biasing circuit comprises an envelope detector receiving the input signal and generating an envelope of the input signal. In addition, the dynamic biasing circuit may comprise a differential amplifier receiving the envelope of the input signal and the drain voltage of the first transistor so as to output an adjustment signal. Further, the dynamic biasing circuit may comprise an attenuator for attenuating the drain voltage inputted to the first transistor.

Preferably, the first transistor and the second transistor are metal oxide semiconductor field effect transistors (MOSFETs) or complementary metal oxide semiconductor field effect transistors (CMOS FETs). More preferable, they are MOSFETs or CMOS FETs manufactured using a 65 nm or a more advanced semiconductor process.

The invention provides a power amplifier having a dynamic biasing circuit, which can dynamically adjust and effectively reduce a voltage drop across a transistor functioning in a common source configuration in the power amplifier according to an input signal. Accordingly, reliability and lifetime of the transistor can be improved.

These and other features, aspects, and advantages of the present invention will become more apparent from the following description of the embodiment of the present invention, with reference to accompanying drawings.

BRIEF DESCRIPTION OF THE DRAWINGS

In the figures.

DESCRIPTION OF THE PREFERRED EMBODIMENTS

As described in the section of Related Art, in the cascoded power amplifier according to the prior art, a voltage drop across a drain and a source in a transistor functioning in a common source configuration in a power amplifier is high because of an amplitude swing of an input RF signal, and accordingly lifetime of the transistor is reduced.

According to the invention, a dynamic biasing circuit is provided in such a manner that a voltage of a drain of a transistor functioning in a common source configuration in a power amplifier can vary dynamically according to an amplitude of a RF signal, and a voltage drop across a drain and a source under average input power is reduced.

A power amplifier according to an embodiment of the invention will be described with reference to accompanying drawings below.

Figure 1:
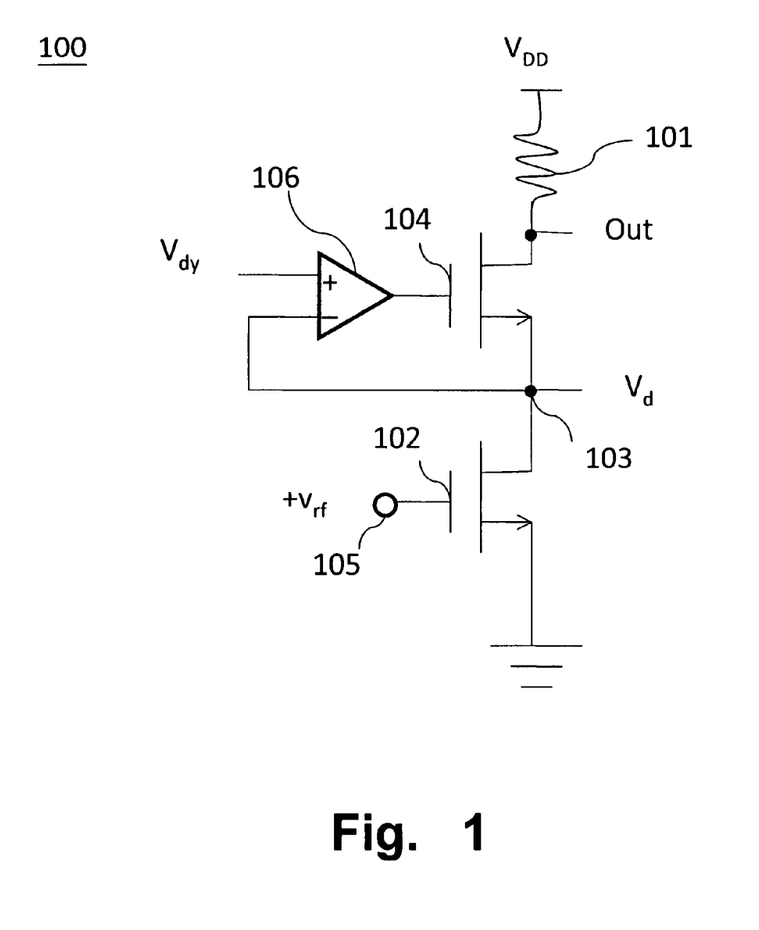
FIG. 1 is a schematic circuit diagram of a power amplifier according to an embodiment of the invention.

FIG. 1 shows a power amplifier 100 according to an embodiment of the invention. As shown in FIG. 1, the power amplifier 100 includes transistors 102 and 104, and a biasing circuit 106. The transistors 102 and 104 are arranged in a cascoded configuration. The transistor 102 functions in a common source configuration in the power amplifier 100, and the transistor 104 functions in a common gate configuration in the power amplifier 100. In one embodiment, the transistors 102 and 104 may be MOSFETs or complementary MOSFETs (CMOS FETs). The drain of the transistor 104 is connected to a power supply $V_{DD}$ via a resistor 101, and the drain serves as an output terminal Out of the power amplifier 100.

An positive terminal of the biasing circuit 106 receives an envelope $V_{dy}$, and a negative terminal is connected to a node 103 at which the transistors 102 and 104 are connected with each other. The voltage at the node 103 is the drain voltage $V_d$ of the transistor 102. The output terminal of the biasing circuit 106 is connected to the gate of the transistor 104.

Figure 2:
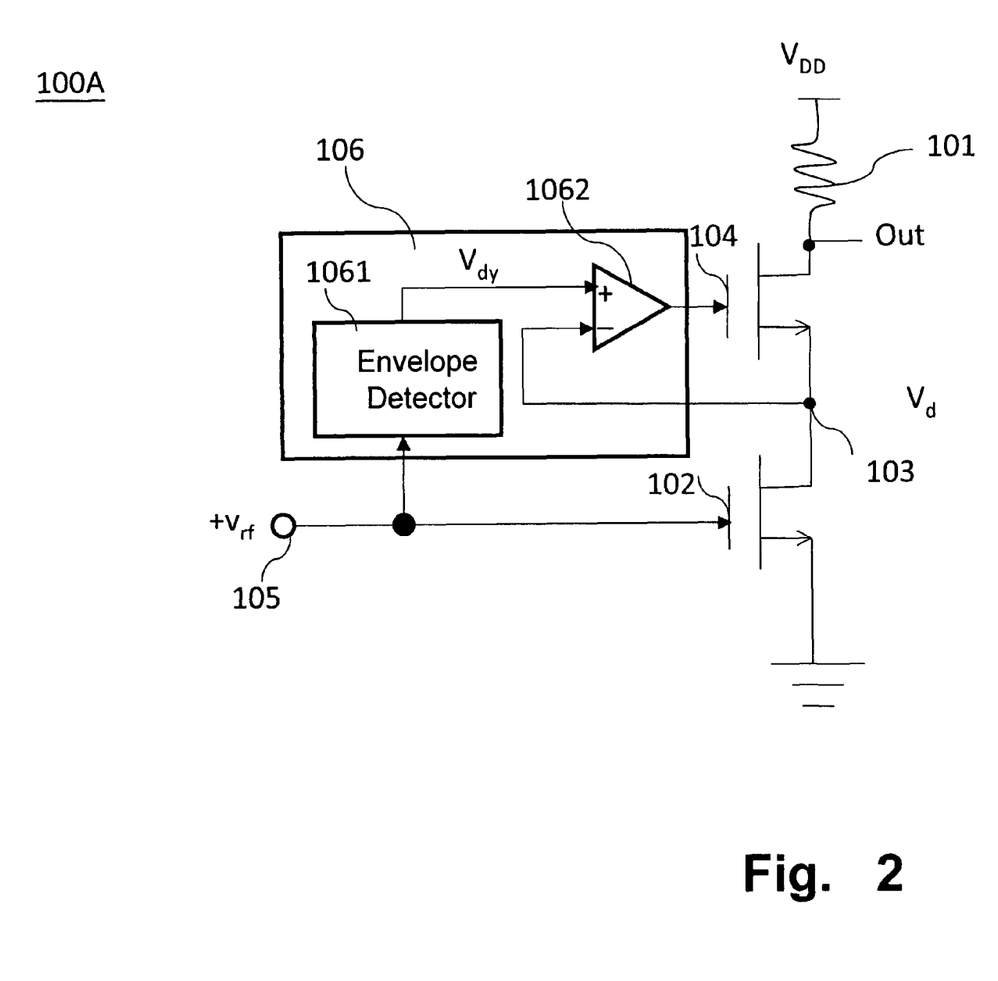
FIG. 2 is a schematic circuit diagram of a power amplifier according to another embodiment of the invention.

FIG. 2 shows a power amplifier 100A according to another embodiment of the invention. As shown in FIG. 2, the biasing circuit 106 further includes an envelope detector 1061 and an amplifier 1062. The envelope detector 1061 receives the input signal $v_{rf}$, and generates the envelope $V_{dy}$ of the RF input signal $v_{rf}$. Since the RF input signal $v_{rf}$ has varying amplitudes, the envelope detector 1061 detects peak values of the amplitudes of the RF input signal $v_{rf}$ in order to achieve the envelope $V_{dy}$.

However, such an envelope may be replaced with a signal corresponding to the RF input signal $v_{rf}$. Accordingly, the envelope detector 1061 may be omitted.

In operation, when the gate 105 of the transistor 102 receives an input signal for operation, the voltage $V_d$ of the drain 103 of the transistor 102 dynamically varies with the envelope $V_{dy}$ due to operation of the power amplifier 1062. The significant effects caused by this embodiment will be further described with reference to $V_d$ measurement graphs shown in FIGS. 3A and 3B below.

Figure 3A:
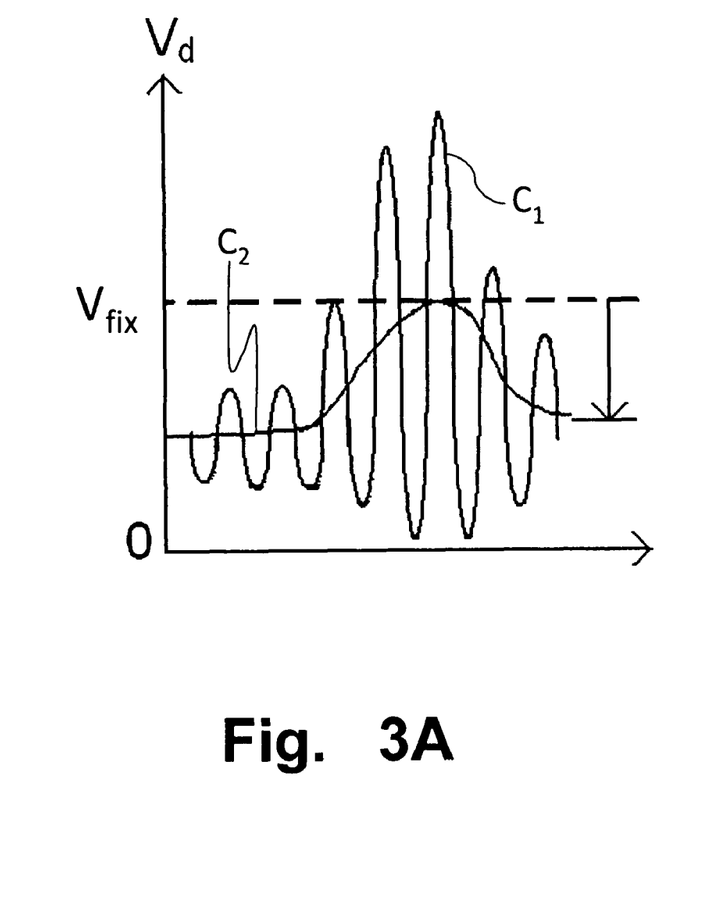
FIGS. 3A and 3B are measurement graphs of $V_d$ for the common source configured transistor in power amplifiers according to the embodiment of the invention and an example of the prior art, respectively.
Figure 3B:
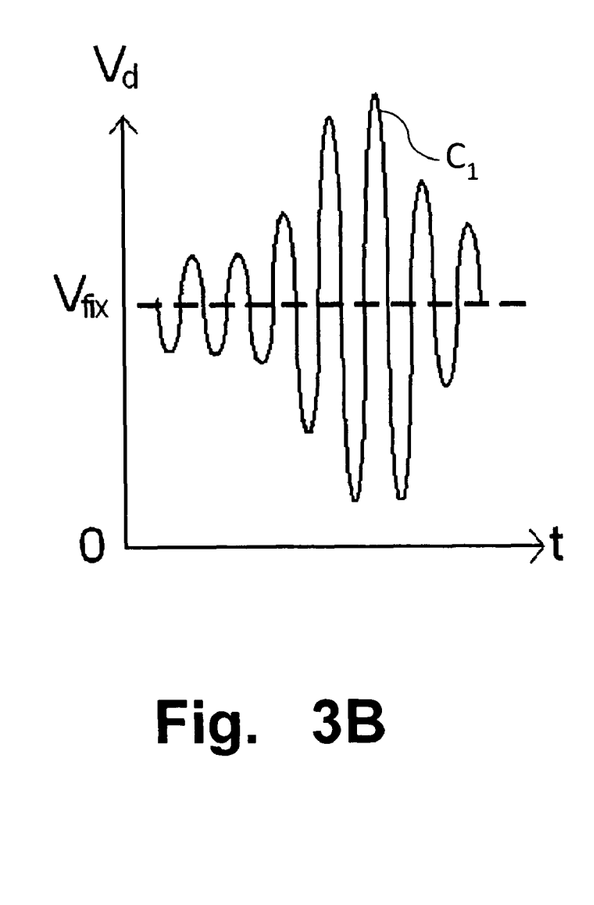

FIG. 3A shows the measurement graph of $V_d$ in the power amplifier 100 according to the embodiment of the invention. FIG. 3B shows the measurement graph of $V_d$ in the power amplifier 200 according to the prior art.

In FIG. 3A, a curve C1 represents a variation of the drain voltage $V_d$ at the drain 103, and a curve C2 represents an envelope $V_{dy}$. It is clearly seen from FIG. 3A that the value of the voltage $V_d$ exceeds a reference value $V_{fix}$ only when the input value of the envelope $V_{dy}$ corresponds to a high power. In FIG. 3B, a curve C1 represents a variation of the drain voltage $V_d$ at the drain 203. It is clearly seen from FIG. 3B that the value of the voltage $V_d$ always exceeds the reference value $V_{fix}$. From descriptions with reference to FIGS. 3A and 3B, the significant difference in the variation of the $V_d$ value between this embodiment and the prior art can be more understood.

Figure 4:
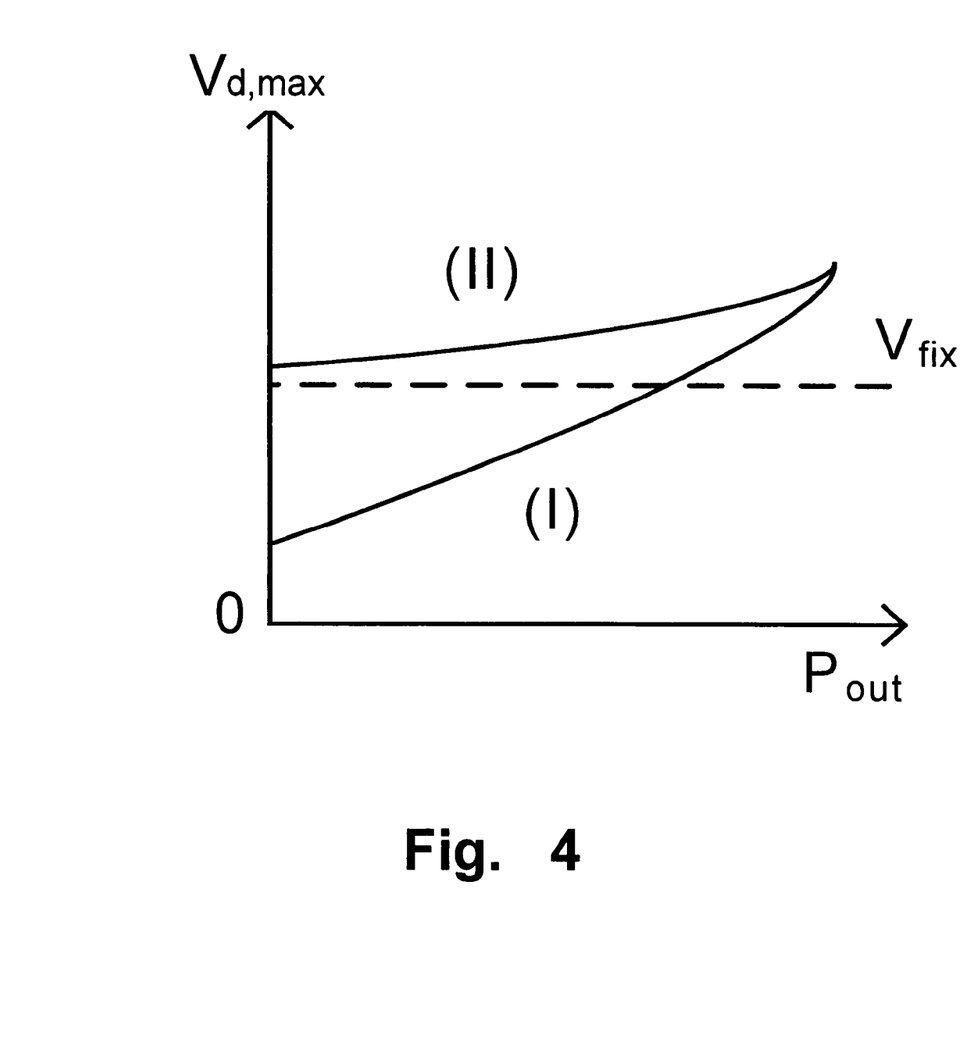
FIG. 4 shows measurement graphs of the maximum voltage drop versus output power for the common source configured transistors in power amplifiers according to the embodiment of the invention and the example of the prior art.

FIG. 4 shows measurement graphs of the maximum voltage drop versus output power for the common source configured transistors in power amplifiers according to the embodiment of the invention and the example of the prior art. In FIG. 4, the vertical axis represents the maximum voltage drop across the drain and the source, and the horizontal axis represents the input power. Here, $V_{ds}$ is the maximum voltage $V_{d,max}$ of $V_d$ because the source is connected to the ground. In FIG. 4, the curve I represents a relation between the output power and the maximum voltage drop across the drain and the source of the common source configured transistor(corresponding to the transistor 102) in the power amplifier 100 according to the embodiment of the invention, whereas the curve II represents a relation between the output power and the maximum voltage drop across the drain and the source of the common source configured transistor (corresponding to the transistor 202) in the power amplifier according to the example of the prior art. It is clearly known from the curves I and II in FIG. 4 that the maximum voltage drop $V_{ds}$ generated by the embodiment of the present invention is significantly lower than that of the prior art for the same output power. Therefore, the power amplifier according to the invention can significantly reduce the maximum voltage drop $V_{ds}$ under the average power. For example, the minimum value of $V_{d,max}$ is about 0.7 V and the maximum value is about 2.0 V in the curve I, whereas the minimum value of $V_{d,max}$ is about 1.4 V, and the maximum value is about 2.0 V in the curve II.

According to the invention, the dynamic biasing circuit is provided in such a manner that the voltage of the drain of the transistor functioning in the common source configuration in the power amplifier can vary dynamically according to the RF signal so as to reduce the voltage drop across the drain and the source, and the reduced voltage drop does not exceed an normal operating voltage. Thus, lifetime of the transistor can be increased and accordingly lifetime and reliability of the power amplifier can be increased.

Figure 1A:
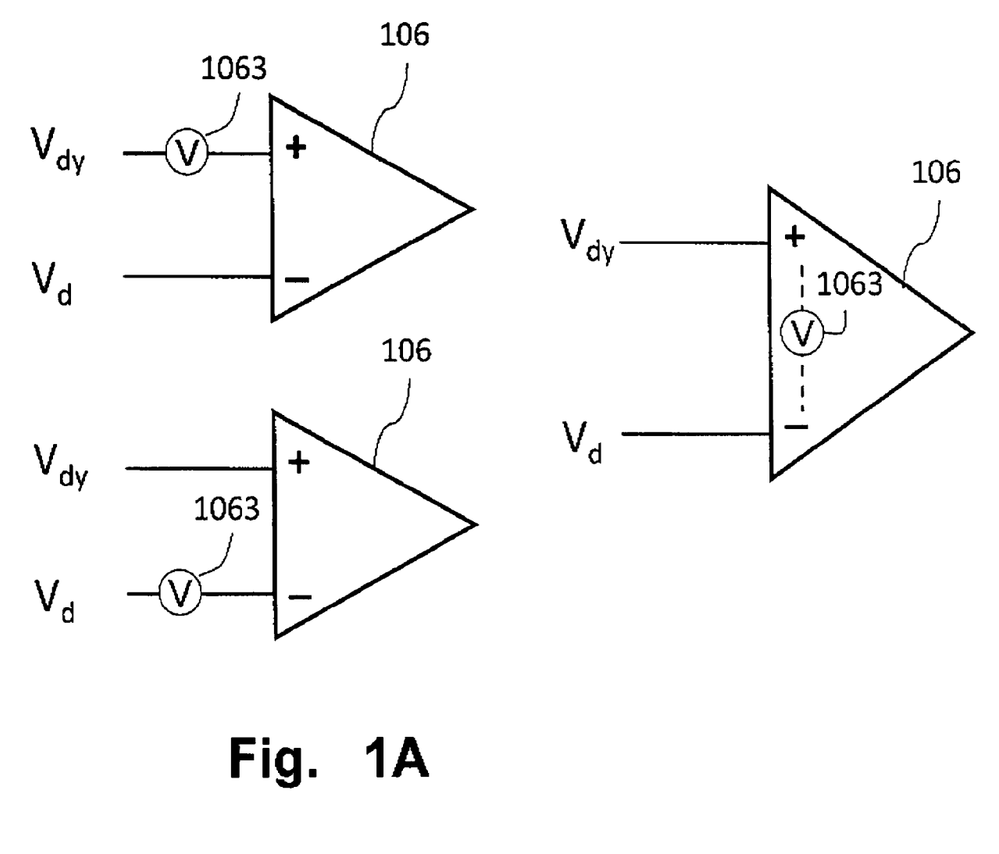
FIG. 1A shows several examples of the biasing circuit 106 other than what is shown in FIG. 1.

While the invention has been explained with reference to preferred embodiments, the invention is not limited to specific details disclosed above. For example, as shown in FIG. 1A, an attenuator 1063 may be provided between one input terminal of the biasing circuit 106 and the drain of the transistor 102 in order to attenuate the voltage inputted to the drain. Or, also as shown, the attenuator 1063 may be directly installed inside the biasing circuit 106. Therefore, various changes, modifications, alternatives, etc. may be made by those skilled in this art without departing the spirits of the invention and should be interpreted to fall within the scope defined by the appended claims and their equivalents.

What is claimed is:

1. A power amplifier, comprising:
   a first transistor having a gate receiving an input signal;
   a second transistor coupled to the first transistor in a cascoded configuration, in which a source of the second transistor is coupled to a drain of the first transistor, and a drain of the second transistor outputs an amplified signal; and
   a dynamic biasing circuit having two input terminals, one of which receiving the input signal, and the other one coupled to the drain of the first transistor, and an output terminal being coupled to a gate of the second transistor, thereby modulating a voltage at the drain of the first transistor.

2. The power amplifier as claimed in claim 1, wherein the dynamic biasing circuit further comprises an envelope detector receiving the input signal and generating an envelope of the input signal.

3. The power amplifier as claimed in claim 2, wherein the dynamic biasing circuit further comprises:
   a differential amplifier having two input terminals, one of which receives the envelope of the input signal, and the other of which receives the voltage at the drain of the first transistor, and an output terminal outputting an adjustment signal,
   wherein, the voltage at the drain of the first transistor is dynamically modulated according to the adjustment signal.

4. The power amplifier as claimed in claim 3, wherein the dynamic biasing circuit further comprises an attenuator for attenuating the drain voltage inputted to the first transistor.

5. The power amplifier as claimed in claim 1, further comprising an attenuator being coupled between the drain of the first transistor and the dynamic biasing circuit to attenuate the drain voltage inputted to the first transistor.

6. The power amplifier as claimed in claim 1, wherein the first transistor and the second transistor are metal oxide semiconductor field effect transistors (MOSFETs).

7. The power amplifier as claimed in claim 1, wherein the first transistor and the second transistor are complementary metal oxide semiconductor field effect transistors (CMOS FETs).

8. A power amplifier circuit, comprising:
   a power amplifier receiving an input signal and a biasing signal and generating an amplified signal according to the input signal, the power amplifier including:
       a first transistor having a first terminal receiving the input signal, a second terminal, and a controlled terminal receiving the biasing signal; and
       a second transistor being coupled to the second terminal of the first transistor and outputting the amplified signal, wherein the second terminal is the node; and
   a bias adjustment unit being coupled to the power amplifier to receive the input signal, and generating the biasing signal according to the input signal, the bias adjustment unit including:
       an envelope detector receiving the input signal and according generating an envelope of the input signal; and
   a differential amplifier receiving the envelope and a voltage at a node of the power amplifier and accordingly outputting a differential amplified signal, the differential amplified signal being used as the biasing signal.

9. A power amplifier circuit, comprising:
   a power amplifier receiving an input signal and a biasing signal and generating an amplified signal according to the input signal, the power amplifier including
       a first transistor having a first terminal receiving the input signal a second terminal, and a controlled terminal receiving the biasing signal; and
       a second transistor being coupled to the second terminal of the first transistor and outputting the amplified signal, wherein the second terminal is the node; and
   a bias adjustment unit being coupled to the power amplifier to receive the input signal, and generating the biasing signal according to the input signal the bias adjustment unit including:
       a differential amplifier receiving an estimation signal corresponding to the input signal and a voltage at a node of the power amplifier and accordingly outputting a differential amplified signal,
       wherein, the differential amplified signal is used as the biasing signal.

10. The power amplifier circuit as claimed in claim 8, further comprising an attenuator being coupled between the node and the bias adjustment unit to attenuate the voltage at the node.

11. The power amplifier circuit as claimed in claim 9, further comprising an attenuator being coupled between the node and the bias adjustment unit to attenuate the voltage at the node.

* * * * *